(12) United States Patent
Mochizuki et al.

(10) Patent No.: US 11,714,140 B2
(45) Date of Patent: Aug. 1, 2023

(54) GROUND FAULT DETECTION DEVICE

(71) Applicant: Yazaki Corporation, Tokyo (JP)

(72) Inventors: Yasuyuki Mochizuki, Makinohara (JP);
Norio Sudo, Makinohara (JP);
Haruhiko Yoshida, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/873,770

(22) Filed: Jul. 26, 2022

(65) Prior Publication Data
US 2023/0048778 A1 Feb. 16, 2023

(30) Foreign Application Priority Data

Aug. 6, 2021 (JP) ................................ 2021-129421

(51) Int. Cl.
| | | |
|---|---|---|
| *G01R 31/52* | (2020.01) | |
| *G01R 31/12* | (2020.01) | |
| *G01R 31/00* | (2006.01) | |
| *G01R 27/26* | (2006.01) | |
| *B60L 3/00* | (2019.01) | |

(52) U.S. Cl.
CPC ......... *G01R 31/52* (2020.01); *G01R 27/2605* (2013.01); *G01R 31/007* (2013.01); *G01R 31/12* (2013.01); *B60L 3/0069* (2013.01); *Y02E 60/10* (2013.01)

(58) Field of Classification Search
CPC ........ G01R 31/00; G01R 31/12; G01R 31/50; G01R 31/52; G01R 27/00; G01R 27/02; G01R 27/025; G01R 27/26; G01R 27/2605; G01R 27/16; G01R 27/18; G01R 31/005; G01R 31/006; G01R 31/007; B60L 3/00; B60L 3/0023; B60L 3/0069; Y02E 60/00; Y02E 60/10
USPC .......................... 324/160, 162, 500, 503, 509
See application file for complete search history.

(56) References Cited

U.S. PATENT DOCUMENTS

| | | | |
|---|---|---|---|
| 8,373,950 B2 * | 2/2013 | Yano ..................... | B60L 3/0023 361/42 |
| 10,613,156 B2 * | 4/2020 | Kawamura .......... | B60L 3/0069 |
| 11,047,923 B2 * | 6/2021 | Kawamura ............ | G01R 31/52 |
| 11,493,564 B2 * | 11/2022 | Takamatsu ............. | G01R 31/12 |
| 2014/0333321 A1 | 11/2014 | Kawamura et al. | |
| 2019/0086464 A1 * | 3/2019 | Kawamura .......... | G01R 27/025 |
| 2020/0064388 A1 * | 2/2020 | Kawamura ............ | G01R 31/50 |

(Continued)

*Primary Examiner* — Hoai-An D. Nguyen
(74) *Attorney, Agent, or Firm* — Sughrue Mion, PLLC

(57) ABSTRACT

A ground fault detection device includes: a detection capacitor; a switch group for switching between a first charging path connecting the battery and the detection capacitor, a second charging path connecting the battery, a negative side insulation resistance and the detection capacitor, a third charging path connecting the battery, a positive side insulation resistance and the detection capacitor, and a measurement path for measuring a charging voltage of the detection capacitor; and a controller configured to calculate the insulation resistance based on a charging voltage measured value of the detection capacitor which exists after charging each of the charging paths, wherein after measurement of the charging voltage of the second charging path, the controller is configured to cause the switch group to switch to the third charging path before switching to the first charging path.

3 Claims, 5 Drawing Sheets

(56) References Cited

U.S. PATENT DOCUMENTS

| | | | | |
|---|---|---|---|---|
| 2020/0191881 A1* | 6/2020 | Kawamura | ............. | H02J 7/345 |
| 2020/0319261 A1* | 10/2020 | Kawamura | ............ | G01R 31/52 |
| 2020/0386827 A1* | 12/2020 | Takamatsu | ......... | G01R 31/3835 |
| 2021/0129675 A1* | 5/2021 | Isaksson | ................. | B60R 16/03 |
| 2021/0148993 A1* | 5/2021 | Takamatsu | ............. | G01R 31/52 |

* cited by examiner

GROUND FAULT DETECTION DEVICE

BACKGROUND OF THE INVENTION

Technical Field

The present invention relates to a ground fault detection device with a flying capacitor.

Background Art

In a hybrid vehicle which is equipped with an engine and an electric motor as a driving source, or in a vehicle powered by an electric motor, such as an electric vehicle, a battery mounted on the vehicle body is charged, wherein a driving force is generated by utilizing electric energy supplied from the battery. Generally, a battery-related power supply circuit is configured as a high-voltage circuit that is intended for a high voltage equal to or greater than 200V. For ensuring safety, such a high-voltage circuit including the battery is configured in a non-grounded manner in which the high-voltage circuit is electrically insulated from the vehicle body serving as a reference potential point of grounding.

A vehicle equipped with a non-grounded high-voltage battery is equipped with a ground fault detection device to monitor a system with the high-voltage battery arranged therein, specifically, an insulated status (ground fault) between the vehicle body and a main power supply system which extends from the high-voltage battery to the motor. In such ground fault detection devices, a system utilizing a capacitor called a flying capacitor is widely used.

In order to know an insulation resistance, the ground fault detection device based on the flying capacitor performs V0 measurement, Vc1$n$ measurement, and Vc1$p$ measurement, wherein these measurements are performed by switching a charging path including a detection capacitor by means of a switch, the detection capacitor configured to function as a flying capacitor. Here, the V0 measurement is a measurement of a charging voltage corresponding to a voltage of the high-voltage battery, the Vc1$n$ measurement is a measurement of a charging voltage which reflects an influence of an insulation resistance on a negative side, and the Vc1$p$ measurement is a measurement of a charging voltage which reflects an influence of an insulation resistance on a positive side.

It is known that an insulation resistance which results from the insulation resistances on the positive and negative insulation resistances can be calculated from voltages V0, Vc1$n$ and Vc1$p$ obtained by the above measurements. Since operations for the calculation are complicated, a conversion map for calculating the insulation resistance is generally provided in advance which uses Vc1/V0 as a reference value (wherein Vc1=Vc1$p$+Vc1$n$), wherein the insulation resistance is calculated from a value of Vc1/V0—which has been obtained by the measurements—by referencing the conversion map in order to determine whether a ground fault occurred.

In order to remove high-frequency noises and/or stabilize the operation, a capacitor referred to as a Y-capacitor (line bypass capacitor) is often connected between a ground and positive and negative power supply lines of the high-voltage battery. In the present specification, stray capacitances which exist between the ground and the positive and negative power supply lines shall be handled as being included in the Y-capacitor. Particularly in recent years, performance enhancement of vehicles has advanced, whereby the stray capacitances tend to be increased.

CITATION LIST

Patent Literature

Patent Document 1: JP 2013-205082 A

SUMMARY OF THE INVENTION

Since exchange of electric charges occurs between the Y-capacitor and the detection capacitor during switching the charging paths, the charging voltage of the detection capacitor may be affected by the Y-capacitor, and an accuracy for calculation of the insulation resistance may be reduced.

The influence of the Y-capacitor will be described. Since a positive side Y-capacitor and a negative side Y-capacitor exist in parallel to the insulation resistances on the positive side and the negative side, respectively. In a state where no changes are applied from the outside, these Y-capacitors are therefore charged in a balance which is determined by a divider voltage ratio of the insulation resistances on the positive and negative sides, whereby the Y-capacitors are stabilized. Here, this state shall be referred to as an equilibrium state. The calculation of the insulation resistances by the ground fault detection device is also performed assuming that a measured value obtained by the V0 measurement corresponding to the voltage of the high-voltage battery is a value which exists in the equilibrium state.

However, this balance may be destroyed in the Vc1$n$ measurement and the Vc1$p$ measurement which reflect the influences of the insulation resistances on the negative side and the positive side, respectively, since each of these measurements uses one of the insulation resistances as a charging path. If the V0 measurement is performed before the balance which has been destroyed is recovered, the above-described assumption that the Y-capacitors are in the equilibrium state may not be satisfied. This results in reduction of the accuracy for calculation of the insulation resistances.

If the V0 measurement is initiated after completely recovering the equilibrium state in order to reduce the influences of the Y-capacitors, this may result in an increased time for ground fault detection. Particularly when the Y-capacitors have a large capacitance, the recovery of the equilibrium state may be substantially delayed in the case of a large ground resistance. It is also conceivable to increase a size of the detection capacitor. However, the required charging time is also extended by an amount corresponding to the increase of the size. Also in this case, the time for ground fault time is increased.

To address this problem, Patent Document 1 describes that an equilibrium state forming circuit is provided which includes a control resistor with its one end being grounded, wherein the control resistor is connected to each of the positive and negative power supply lines via a control switch. According to the invention described in Patent Document 1, after the balance has been destroyed due to the Vc1$n$/Vc1$p$ measurement, the recovery of the equilibrium state may be facilitated by switching the control switch to be closed and thus rapidly transitioning the charged status of the Y-capacitors on the positive/negative side to the divider voltage ratio of the control resistor.

This enables an accuracy for detection of the insulation resistances to be prevented from being reduced due to the influence of the Y-capacitors without increase in the ground fault detection time. On the other hand, it is necessary to provide dedicated circuits, i.e., the equilibrium state forming circuits, which results in increased costs.

Therefore, an objective of the present invention is to prevent an accuracy for detection of an insulation resistance from being reduced due to influence of a Y-capacitor without increase in a detection time and costs.

In order to achieve the above-mentioned objective, a ground fault detection device according to a first aspect of the present invention is configured to be connected to a non-grounded battery and to calculate an insulation resistance of a system with the battery provided therein, comprising: a detection capacitor configured to be operated as a flying capacitor; a switch group for switching between a first charging path connecting the battery and the detection capacitor, a second charging path connecting the battery, a negative side insulation resistance and the detection capacitor, the negative side insulation resistance being an insulation resistance for a negative side line of the battery to a ground, a third charging path connecting the battery, a positive side insulation resistance and the detection capacitor, the positive side insulation resistance being an insulation resistance for a positive side line of the battery to the ground, and a measurement path for measuring a charging voltage of the detection capacitor; and a controller configured to control the switch group and to calculate the insulation resistance based on a charging voltage measured value of the detection capacitor which exists after charging each of the charging paths, wherein after measurement of the charging voltage of the second charging path, the controller is configured to cause the switch group to temporarily switch to the third charging path before switching to the first charging path.

In one or some embodiments, after measurement of the charging voltage of the third charging path, the controller is further configured to cause the switch group to temporarily switch to the second charging path before switching to the first charging path.

In order to achieve the above-mentioned objective, a ground fault detection device according to a second aspect of the present invention is configured to be connected to a non-grounded battery and to calculate an insulation resistance of a system with the battery provided therein, comprising: a detection capacitor configured to be operated as a flying capacitor; a switch group for switching between a first charging path connecting the battery and the detection capacitor, a second charging path connecting the battery, a negative side insulation resistance and the detection capacitor, the negative side insulation resistance being an insulation resistance for a negative side line of the battery to a ground, a third charging path connecting the battery, a positive side insulation resistance and the detection capacitor, the positive side insulation resistance being an insulation resistance for a positive side line of the battery to the ground, and a measurement path for measuring a charging voltage of the detection capacitor; and a controller configured to control the switch group and to calculate the insulation resistance based on a charging voltage measured value of the detection capacitor which exists after charging each of the charging paths, wherein after measurement of the charging voltage of the third charging path, the controller is configured to cause the switch group to temporarily switch to the second charging path before switching to the first charging path.

DETAILED DESCRIPTION OF THE PREFERRED EMBODIMENTS

Figure 1:
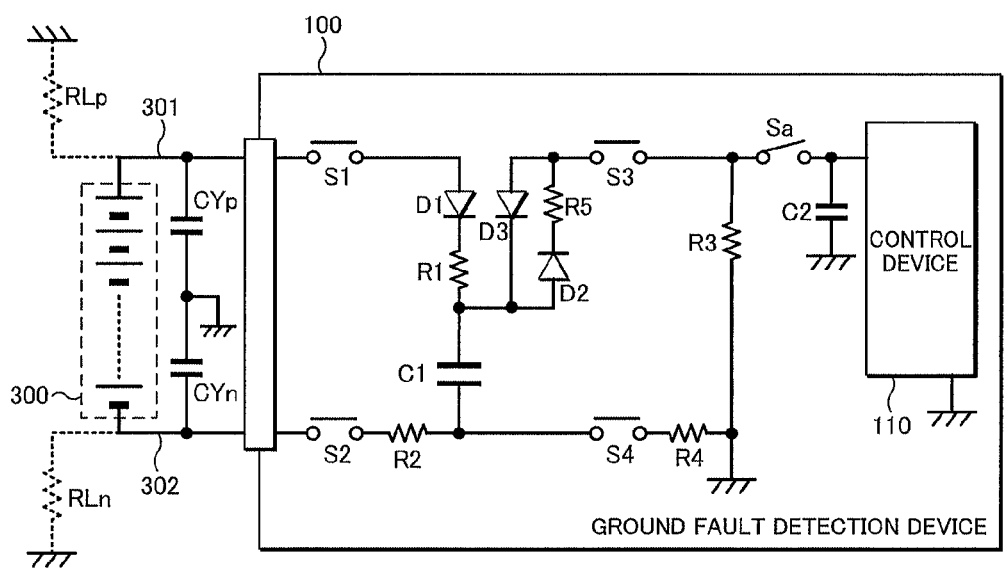
FIG. 1 is a block diagram illustrating a configuration of a ground fault detection device according to an embodiment of the present invention.

Embodiments of the present invention will be described in details with reference to the Drawings. FIG. 1 shows a block diagram illustrating a configuration of a ground fault detection device 100 according to an embodiment of the present invention. As shown in this figure, the ground fault detection device 100 is a device based on a flying capacitor, wherein the device is configured to be connected to a high-voltage battery 300 and for detecting ground faults in a system with the high-voltage battery 300 arranged therein. Here, RLp and RLn shall represent an insulation resistance between a ground and a cathode side of the high-voltage battery 300 and an insulation resistance between the ground and an anode side of the high-voltage battery 300, respectively.

The high-voltage battery 300 is a battery used for driving the vehicle. The high-voltage battery 300 is formed by a chargeable battery such as a lithium-ion battery and drives a load such as an electric motor (not shown) which is connected to a cathode side power supply line 301 and/or an anode side power supply line 302.

Capacitors CYp and CYn referred to as Y-capacitors are connected between the cathode side power supply line 301 and the ground and between the anode side power supply line 302 and the ground, respectively. Here, stray capacitances between the ground and each of the power supply lines 301 and 302 shall also be handled as being included in the Y-capacitors CYp, CYn.

As shown in this figure, the ground fault detection device 100 includes a detection capacitor C1 and a control device 110, wherein the detection capacitor C1 operates as a flying capacitor. The ground fault detection device 100 further includes four switches S1 to S4 around the detection capacitor C1 for switching a charging path of the detection capacitor C1 and for forming a charging voltage measurement path. These switches can be formed by insulating switching elements, such as optical MOSFETs. Furthermore, the ground fault detection device 100 includes a switch Sa for sampling a voltage for measurement corresponding to a charging voltage of the detection capacitor C1.

A switch S1 has a first end connected to the cathode side power supply line 301 and a second end connected to an anode side of a diode D1. A cathode side of the diode D1 is connected to a first end of a resistor R1, wherein a second end of the resistor R1 is connected to a first pole of the detection capacitor C1. A switch S2 has a first end connected to the anode side power supply line 302 and a second end connected to a first end of a resistor R2. A second end of the resistor R2 is connected to a second pole of the detection capacitor C1.

A switch S3 has a first end connected to a first end of a resistor R5 and an anode side of a diode D3, and a second end connected to a first end of a resistor R3 and a first end of the switch Sa. A second end of the switch Sa has a second end connected to an analog input terminal of the control device 110 and a first pole of a capacitor C2, wherein the capacitor C2 has a second grounded pole. A cathode side of the diode D3 is connected to the first pole of the detection capacitor C1, and a second end of the resistor R5 is connected to a cathode side of a diode D2. An anode side of the diode D2 is connected to the first pole of the detection capacitor C1. The resistor R3 has a second grounded end. A switch S4 has a first end connected to the second pole of the detection capacitor C1 and a second end connected to a first end of a resistor R4. The resistor R4 has a second grounded end.

The control device 110 is formed e.g. by a microcomputer and performs various controls required for the ground fault detection device 100 by executing a program incorporated in the control device 110 in advance. Specifically, the control device 110 switches the charging path by controlling the switches S1 to S4 as well as the switch Sa individually and controls the charging voltage measurement and discharge of the detection capacitor C1.

Although a basic circuit configuration has been described above which is widely used in the ground fault detection device based on the flying capacitor, there are also various exemplary modifications of a ground fault detection device based on a flying capacitor, and the configuration of the ground fault detection device 100 is not limited to the example of the figure.

In order to know the insulation resistances RLp and RLn, the ground fault detection device 100 repeats measurement operation in the same manner as in the prior art, wherein one cycle for the measurement operation is defined as a sequence of a V0 measurement period->a Vc1$n$ measurement period->a V0 measurement period->a Vc1$p$ measurement period. In the present embodiment, however, immediately after the Vc1$n$ measurement period and Vc1$p$ measurement period which results in a loss of the charged status balance of the Y-capacitors CYp and CYn, electric charge in these Y-capacitors is forced to be discharged in order to rapidly bring the Y-capacitors close to the equilibrium state. This operation will be described below.

In all of the V0 measurement period, Vc1$n$ measurement period and Vc1$p$ measurement period, the detection capacitor C1 is charged through the respective charging paths before performing the measurement of the charging voltage of the detection capacitor C1. Subsequently, the detection capacitor C1 is discharged for a next measurement.

Figure 2A:
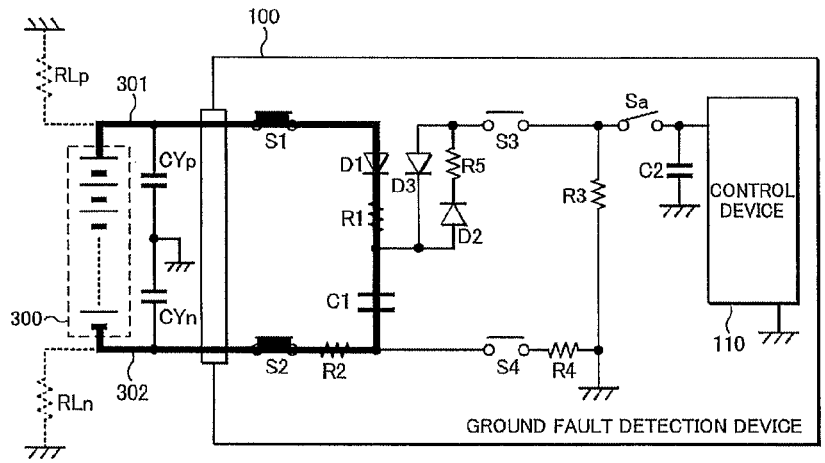
FIG. 2A is a diagram for explanation of a V0-charging path and a measurement path.

In the V0 measurement period, a voltage is measured which corresponds to a voltage of the high-voltage battery 300. For this purpose, the switches S1 and S2 are switched on and the switches S3 and S4 are switched off in order to charge the detection capacitor C1. This means that the high-voltage battery 300, the resistor R1, the detection capacitor C1 and the resistor R2 form a charging path, as shown in FIG. 2A. This charging path connecting the high-voltage battery 300 to the detection capacitor C1 shall be referred to as a V0-charging path or a first charging path.

Figure 2B:
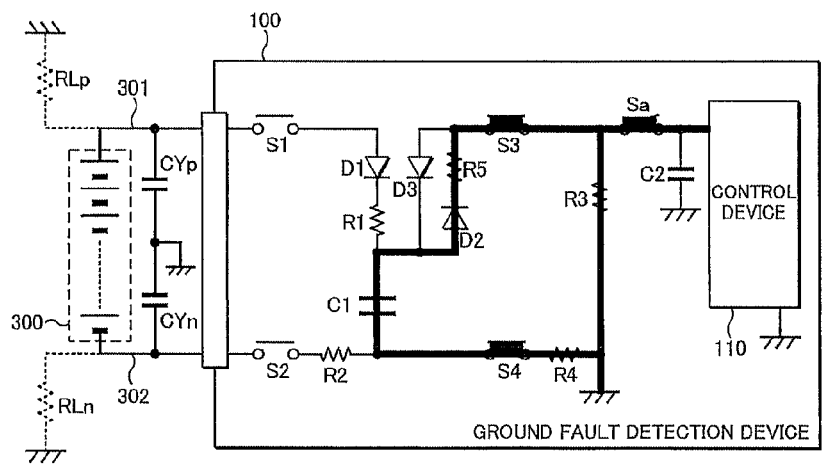
FIG. 2B is a diagram for explanation of the V0-charging path and the measurement path.
Figure 2C:
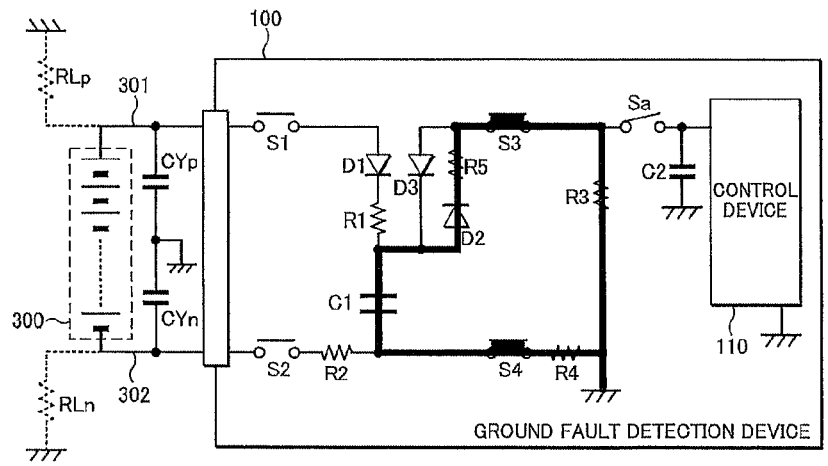
FIG. 2C is a diagram for explanation of the V0-charging path and the measurement path.

For measurement of the charging voltage of the detection capacitor C1, the switches S1 and S2 are switched off, the switches S3 are S4 are switched on, and the switch Sa is switched on, as shown in FIG. 2B, wherein the control device 110 then performs sampling. Subsequently, the detection capacitor C1 is discharged for a next measurement by switching off the switch Sa, as shown in FIG. 2C. The measurement of the charging voltage of the detection capacitor C1 and the operation of the discharge of the detection capacitor C1 are performed in the same manner in the remaining measurement periods.

A path which is formed by switching off the switches S1 and S2 and switching on the switches S3 and S4 shall be referred to as a measurement path. That is, the discharge of the charging voltage measurement and the detection capacitor C1 of the detection capacitor C1 is performed in the measurement path.

Figure 3A:
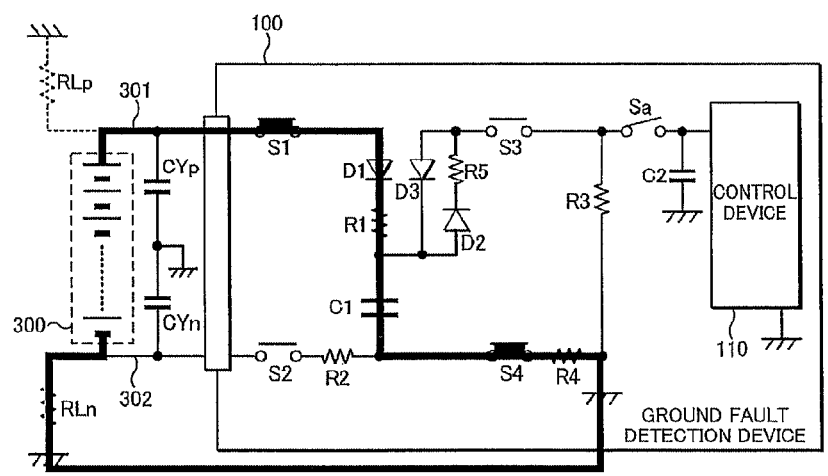
FIG. 3A is a diagram for explanation of a Vc1$n$-charging path and a Vc1$p$-charging path.

In the Vc1$n$ measurement period, a voltage reflecting the influence of the insulation resistance RLn is measured. For this purpose, the switches S1 and S4 are switched on and the switches S2 and S3 are switched off in order to charge the detection capacitor C1. This means that the high-voltage battery 300, the resistor R1, the detection capacitor C1, the resistor R4 and the insulation resistance RLn form a charging path, as shown in FIG. 3A. This charging path connecting the high-voltage battery 300, the insulation resistance RLn and the detection capacitor C1 shall be referred to as a Vc1$n$-charging path or a second charging path.

Figure 3B:
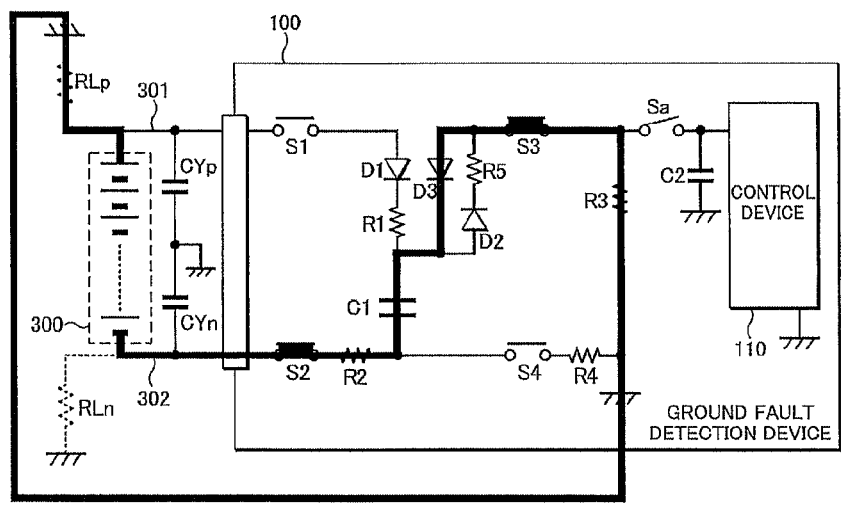
FIG. 3B is a diagram for explanation of the Vc1$n$-charging path and the Vc1$p$-charging path.

In the Vc1$p$ measurement period, a voltage reflecting the influence of the insulation resistance RLp is measured. For this purpose, the switches S2 and S3 are switched on and the switches S1 and S4 are switched off in order to charge the detection capacitor C1. That is, as shown in FIG. 3B, the high-voltage battery 300, insulation resistance RLp, ground, resistance R3, resistance R1, the detection capacitor C1 is the charging path. This charging path connecting the high-voltage battery 300, the insulation resistance RLp and the detection capacitor C1 shall be referred to as a Vc1$p$-charging path or a third charging path.

Based on the voltages V0, Vc1$n$ and Vc1$p$ obtained during these measurement periods, the control device 110 calculates the insulation resistance. In the case where the calculated value is equal to or lower than a predetermined criterion level, it is determined that a ground fault has occurred, and an alarm is outputted.

Next, operation will be described in which electric charge in the Y-capacitors CYp and CYn which are in a non-equilibrium state due to forming the Vc1$n$ charging path/Vc1$p$ charging path is forced to be discharged for rapidly bringing the Y-capacitors close to the equilibrium state.

Figure 4:
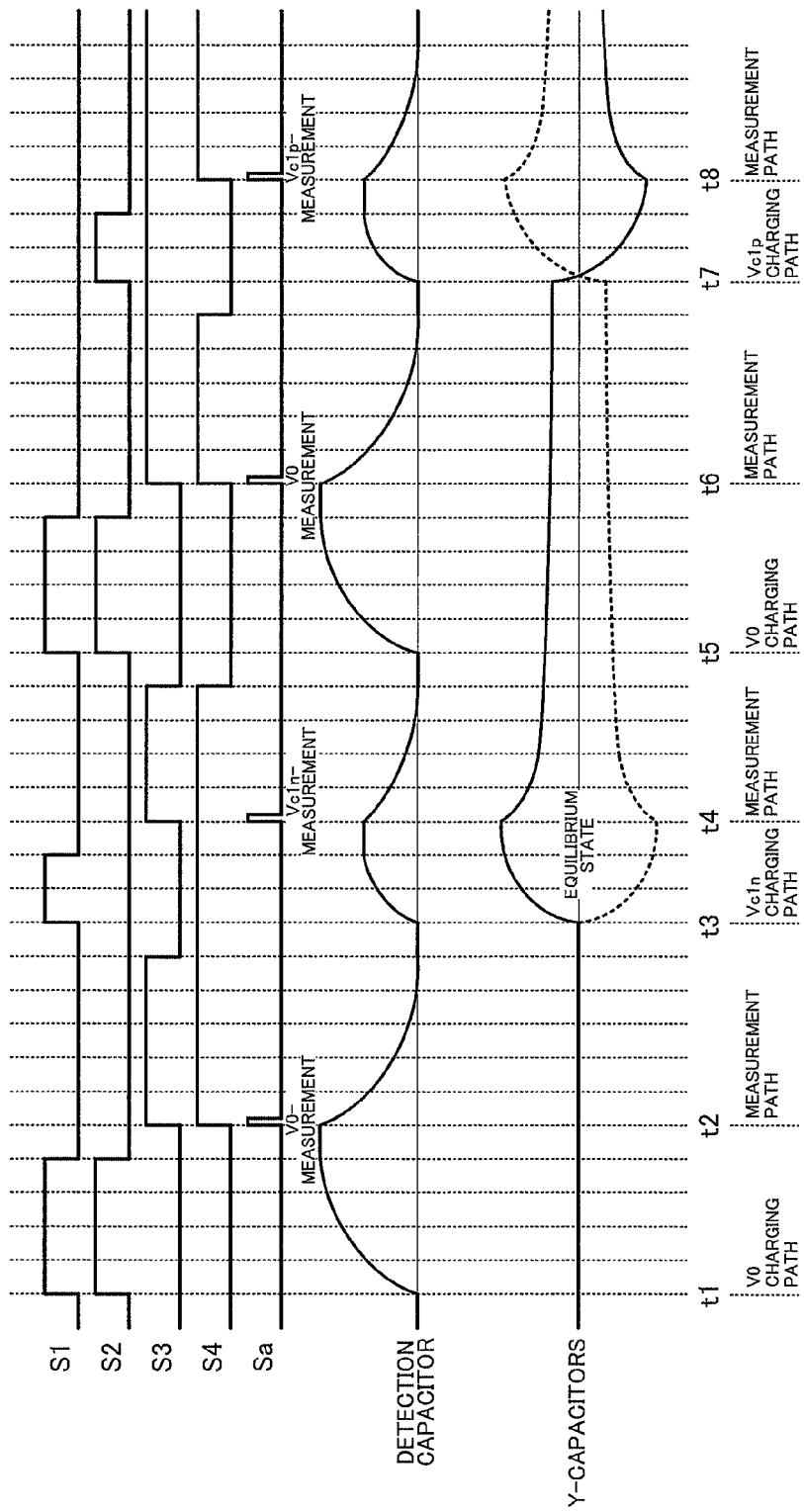
FIG. 4 is a timing diagram for explanation of a charged status of Y-capacitors during a general measurement cycle according to the prior art.

First, charged states of the Y-capacitors CYp and CYn during a conventional, general measurement cycle will be described as a reference example for comparison to embodiment of the present invention with reference to a timing diagram in FIG. 4.

As described above, the ground fault detection process repeats the measurement operation which has a cycle defined as a sequence of a V0 measurement period->a Vc1$n$ measurement period->a V0 measurement period->a Vc1$p$ measurement period. In an initial state, the Y-capacitors CYp and CYn shall be in the equilibrium state.

At t1, the switch S1 and the switch S2 are switched on and the switch S3 and the switch S4 are switched off to form the V0 charging path. In this manner, the detection capacitor C1 is charged as V0.

At t2 after a predetermined time has elapsed, the switch S1 and the switch S2 are switched off, the switch S3 and the switch S4 are switched on and the switch Sa is switched on for forming the measurement path, wherein V0 is then measured. Once V0 has been measured, the switch Sa is switched off. The detection capacitor C1 is discharged through the resistor R3 and resistor R4.

At t3, the switch S1 and the switch S4 are switched on and the switch S2 and the switch S3 are switched off to form the Vc1$n$ charging path. In this manner, the detection capacitor C1 is charged as Vc1$n$. In the Vc1$n$ charging path, the insulation resistance RLn forms part of the charging path, which destroys the balance between the Y-capacitors CYp (wavy line) and CYn (solid line) and thus increases the degree of non-equilibrium.

At t4 after a predetermined time has elapsed, the switch S1 and the switch S2 are switched off, the switch S3 and the switch S4 are switched on and the switch Sa is switched on for forming the measurement path, wherein Vc1$n$ is then measured. Once Vc1$n$ has been measured, the switch Sa is switched off. The detection capacitor C1 is discharged through the resistor R3 and resistor R4. The Y-capacitors CYp and CYn slowly transition to the equilibrium state with time constants of their capacitances and positive and negative insulation resistances.

At t5, the switch S1 and the switch S2 are switched on and the switch S3 and the switch S4 are switched off to form the V0 charging path. In this manner, the detection capacitor C1 is charged as V0. However, the Y-capacitors CYp, CYn are not returned to the equilibrium state from the non-equilibrium state, which affects the charging voltage of the detection capacitor C1. Therefore, if the insulation resistance is calculated by using the V0 measured value obtained at t6 after a predetermined time has elapsed, this reduces the calculation accuracy. The same applies to the V0 measurement of the next cycle after forming the Vc1$p$ charging path at t7.

Figure 5:
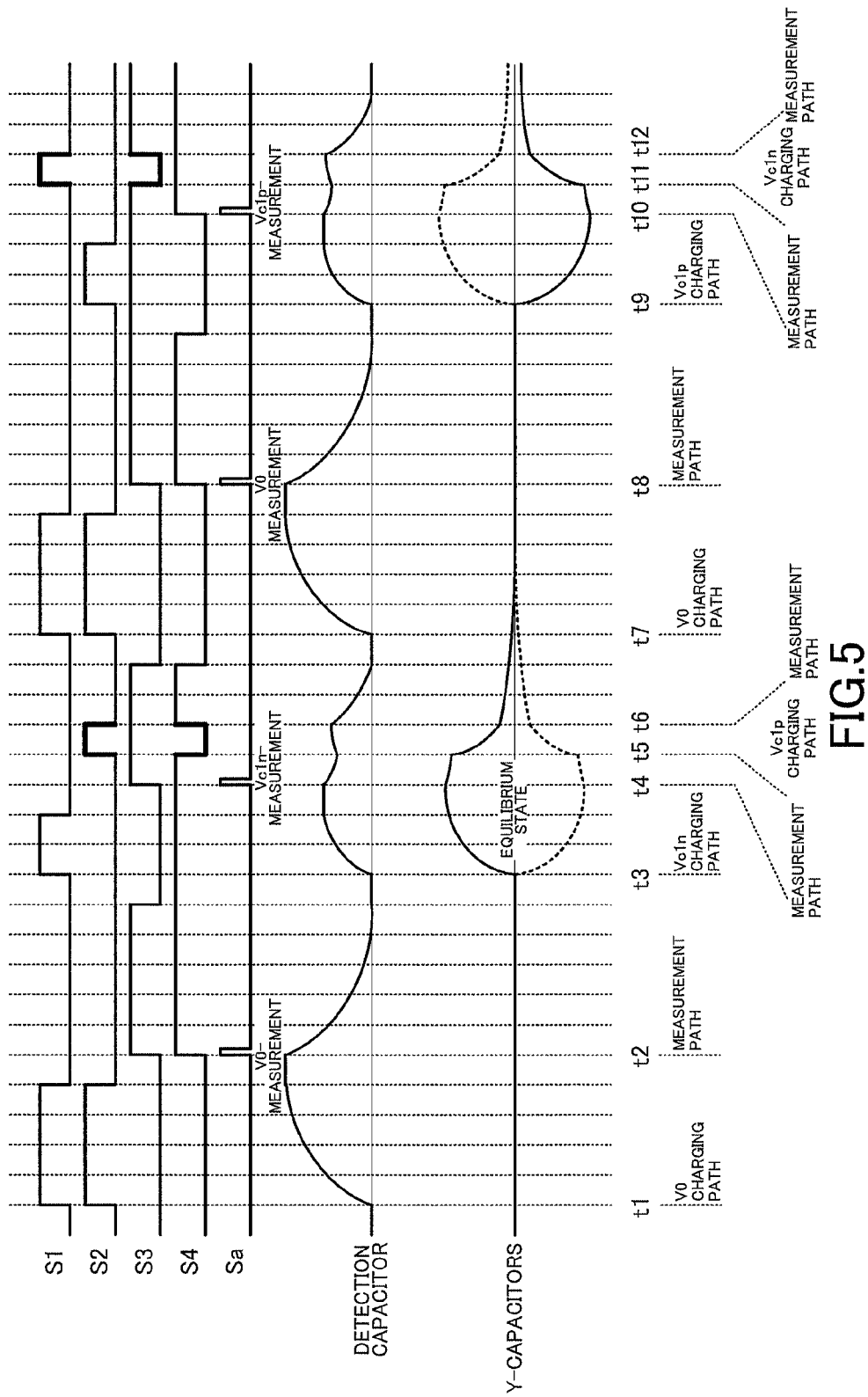
FIG. 5 is a timing diagram for explanation of a charged status of Y-capacitors during a measurement according to the embodiment.

Next, charged states of the Y-capacitors CYp and CYn during a measurement cycle which is performed by the ground fault detection device 100 of the above-described embodiment will be described as a reference example for comparison to embodiment of the present invention with reference to a timing diagram in FIG. 5. Basically, the ground fault detection process according to the present embodiment also repeats measurement operation which has a cycle defined as a sequence of the V0 measurement period->the Vc1$n$ measurement period->the V0 measurement period->the Vc1$p$ measurement period. In an initial state, the Y-capacitors CYp and CYn shall be in the equilibrium state. Further, the following process is performed under control of the control device 110.

At t1, the switch S1 and the switch S2 are switched on and the switch S3 and the switch S4 are switched off to form the V0 charging path. In this manner, the detection capacitor C1 is charged as V0.

At t2 after a predetermined time has elapsed, the switch S1 and the switch S2 are switched off, the switch S3 and the switch S4 are switched on and the switch Sa is switched on for forming the measurement path, wherein V0 is then measured. Once V0 has been measured, the switch Sa is switched off. The detection capacitor C1 is discharged through the resistor R3 and resistor R4.

At t3, the switch S1 and the switch S4 are switched on and the switch S2 and the switch S3 are switched off to form the Vc1$n$ charging path. In this manner, the detection capacitor C1 is charged as Vc1$n$. In the Vc1$n$ charging path, the insulation resistance RLn forms part of the charging path, which destroys the balance between the Y-capacitors CYp (wavy line) and CYn (solid line) and thus increases the degree of non-equilibrium.

At t4 after a predetermined time has elapsed, the switch S1 and the switch S2 are switched off, the switch S3 and the switch S4 are switched on and the switch Sa is switched on for forming the measurement path, wherein Vc1$n$ is then measured. Once Vc1$n$ has been measured, the switch Sa is switched off. The detection capacitor C1 is discharged.

Immediately after that, at t5 prior to switching to the V0 charging path, temporarily switching to the Vc1$p$ charging path is performed. This means that the switches S1 and S4 are switched off and the switches S2 and S3 are switched on. In this manner, the detection capacitor C1 is charged toward Vc1$p$. Furthermore, since the Y-capacitors CYp and CYn are forced to be discharge in a direction opposite to the Vc1$n$ charging path, the Y-capacitors rapidly transition to the equilibrium state.

At the following time t6, the switch S1 and the switch S2 are switched off and the switch S3 and the switch S4 are switched on for switching to the measurement path again in order to discharge the detection capacitor C1. The Y-capacitors CYp and CYn transition to the equilibrium state with time constants of their capacitances and positive and negative insulation resistances. However, they are already sufficiently close to the equilibrium state due to the forced charging and discharging in the opposite directions.

At t7, the switch S1 and the switch S2 are switched on and the switch S3 and the switch S4 are switched off to form the V0 charging path. In this manner, the detection capacitor C1 is charged as V0. Since the Y-capacitors CYp and CYn have been almost returned to the equilibrium state, they do not affect the charging voltage of the detection capacitor C1.

After measuring V0 at t8, the switch S2 and switch S3 are switched on and the switch S1 and switch S4 are switched off at t9 for switching to the Vc1$p$ charging path. Thereafter, the Y-capacitors CYp and CYn are forced to be charged/discharged in the opposite directions in a similar manner as described above.

This means that at t10, switching to the measurement path is performed and Vc1$p$ is measured, and immediately after that, switching to the Vc1$n$ charging path is temporarily performed at t11 before switching to the V0 charging path. This means that the switches S1 and S4 are switched on and the switches S2 and S3 are switched off. Since the Y-capacitors CYp and CYn are forced to be discharge in a direction opposite to the Vc1$n$ charging path in the above-described manner, the Y-capacitors rapidly transition to the equilibrium state. At the following time t12, the switch S1 and the switch S2 are switched off and the switch S3 and the switch S4 are switched on for switching to the measurement path again in order to discharge the detection capacitor C1. In the V0 charging path during the next cycle, the Y-capacitors CYp, CYn do not affect the charging voltage of the detection capacitor C1 since the Y-capacitors CYp and CYn have been almost returned to the equilibrium state.

As described above, according to the ground fault detection device 100 of the present embodiment, even when the Y-capacitors are brought into the non-equilibrium state due to the influence of the charging path, the Y-capacitors are rapidly returned to the equilibrium state since they are forced to be charged/discharged in the opposite directions immediately after the charging voltage measurement. In this manner, it is possible to prevent the accuracy for detection of the insulation resistances from being reduced due to the influence of the Y-capacitors without increase in the detection time. In addition, software-based control is sufficient to force the Y-capacitors to be charged/discharged in the opposite directions without the need for a dedicated device, such as an equilibrium state forming circuit, since the Y-capacitors are charged/discharged by temporarily switching the charging path, which may not result in increased costs.

Although the present embodiment has been described with reference to the example where the measurement operation is repeated which has a cycle defined as the sequence of the V0 measurement period->the Vc1$n$ measurement period->the V0 measurement period->the Vc1$p$ measurement period, it is to be noted that the present invention may also be applied to measurement which has a cycle defined as a sequence of the V0 measurement period->Vc1$n$ measurement period->Vc1$p$ measurement period or a sequence of the V0 measurement period->Vc1$p$ measurement period->V0 measurement period->Vc1$n$ measurement period. In any case, after the charged state of the Y-capacitors are brought to non-equilibrium in the Vc1$n$ charging path/Vc1$p$ charging path, it is sufficient to force the Y-capacitors to be charged/discharged in the opposite directions before switching to the V0 charging path.

| Reference Signs List | |
|---|---|
| 100 | Ground fault detection device |
| 110 | Control device |
| 300 | High-voltage battery |
| 301 | Cathode side power supply line |
| 302 | Anode side power supply line |
| C1 | Detection capacitor |
| CYp | Y-capacitor |
| CYn | Y-capacitor |
| RLp | Cathode side insulation resistance |
| RLn | Anode side insulation resistance |
| S1-S4 and Sa | Switches |

What is claimed is:

1. A ground fault detection device configured to be connected to a non-grounded battery and to calculate an insulation resistance of a system with the battery provided therein, comprising:
   a detection capacitor configured to be operated as a flying capacitor;
   a switch group for switching between
      a first charging path connecting the battery and the detection capacitor,
      a second charging path connecting the battery, a negative side insulation resistance and the detection capacitor, the negative side insulation resistance being an insulation resistance for a negative side line of the battery to a ground,
      a third charging path connecting the battery, a positive side insulation resistance and the detection capacitor, the positive side insulation resistance being an insulation resistance for a positive side line of the battery to the ground, and
      a measurement path for measuring a charging voltage of the detection capacitor; and
   a controller configured to control the switch group and to calculate the insulation resistance based on a charging voltage measured value of the detection capacitor which exists after charging each of the charging paths,
   wherein after measurement of the charging voltage of the second charging path, the controller is configured to cause the switch group to temporarily switch to the third charging path before switching to the first charging path.

2. The ground fault detection device according to claim 1, wherein after measurement of the charging voltage of the third charging path, the controller is further configured to cause the switch group to temporarily switch to the second charging path before switching to the first charging path.

3. A ground fault detection device configured to be connected to a non-grounded battery and to calculate an insulation resistance of a system with the battery provided therein, comprising:
   a detection capacitor configured to be operated as a flying capacitor;
   a switch group for switching between
      a first charging path connecting the battery and the detection capacitor,
      a second charging path connecting the battery, a negative side insulation resistance and the detection capacitor, the negative side insulation resistance being an insulation resistance for a negative side line of the battery to a ground,
      a third charging path connecting the battery, a positive side insulation resistance and the detection capacitor, the positive side insulation resistance being an insulation resistance for a positive side line of the battery to the ground, and
      a measurement path for measuring a charging voltage of the detection capacitor; and
   a controller configured to control the switch group and to calculate the insulation resistance based on a charging voltage measured value of the detection capacitor which exists after charging each of the charging paths,
   wherein after measurement of the charging voltage of the third charging path, the controller is configured to cause the switch group to temporarily switch to the second charging path before switching to the first charging path.

* * * * *